(12) United States Patent
Lo et al.

(10) Patent No.: US 6,555,902 B2
(45) Date of Patent: Apr. 29, 2003

(54) MULTIPLE STACKED-CHIP PACKAGING STRUCTURE

(75) Inventors: Randy H. Y. Lo, Taichung Hsien (TW); Chien-Ping Huang, Hsinchu Hsien (TW); Chi-Chuan Wu, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/895,553

(22) Filed: Jun. 28, 2001

(65) Prior Publication Data

US 2002/0014689 A1 Feb. 7, 2002

(30) Foreign Application Priority Data

Jul. 17, 2000 (TW) ........................................ 89114232 A

(51) Int. Cl.⁷ ........................... H01L 23/02; H01L 23/52
(52) U.S. Cl. .................. 257/686; 257/685; 257/777; 257/723; 257/787; 257/773
(58) Field of Search ............................. 257/686, 685, 257/777, 723, 787, 773, 737, 738, 783; 361/742, 758, 770, 790, 840

(56) References Cited

U.S. PATENT DOCUMENTS

| | | | | |
|---|---|---|---|---|
| 5,726,492 A | * | 3/1998 | Suzuki et al. | 257/685 |
| 6,005,778 A | * | 12/1999 | Spielberger et al. | 257/686 |
| 6,229,217 B1 | * | 5/2001 | Fukui et al. | 257/685 |
| 6,238,949 B1 | * | 5/2001 | Nguyen et al. | 257/777 |
| 6,351,028 B1 | * | 2/2002 | Akram | 257/686 |
| 6,376,904 B1 | * | 4/2002 | Haba et al. | 174/52.2 |

* cited by examiner

Primary Examiner—Minh Loan Tran
Assistant Examiner—Tan Tran
(74) Attorney, Agent, or Firm—J. C. Patents

(57) ABSTRACT

A packaging structure comprises a substrate, a plurality of semiconductor chips contiguously mounted into a plurality of stacked semiconductor chip sets, a plurality of supporting members, a plurality of adhesive layers, a plurality of wires and a molding compound. Each of the semiconductor chip sets comprises at least a semiconductor chip, each semiconductor chip having plurality of bonding pads. The size deviation between the semiconductor chip sets is less than 0.3 mm. The supporting members separate from one another the semiconductor chip sets stacked above the substrate. The adhesive layers bond the substrate, the supporting members and the semiconductor chips to one another. The wires connect the semiconductor chips to one another and to the substrate. The molding compound encapsulates the substrate, the semiconductor chips, the supporting members, and the adhesive layers.

15 Claims, 9 Drawing Sheets

MULTIPLE STACKED-CHIP PACKAGING STRUCTURE

CROSS-REFERENCE TO RELATED APPLICATION

This application claims the priority benefit of Taiwan application serial no. 89114232, filed Jul. 17, 2001.

BACKGROUND OF THE INVENTION

1. Field of the Invention

The present invention relates to a semiconductor packaging structure, and more particularly to a semiconductor BGA packaging structure.

2. Description of the Related Art

As the era of information technology progresses, integrated circuits are present in every aspect of daily life. As semiconductor technology progresses, the design tends to lighter, thinner, shorter and smaller products in order to provide customers with comfortable use.

Semiconductor manufacturing has already entered the level of 0.18-micron, and semiconductor products having better performance are forthcoming. The manufacturing of IC products is essentially composed of 3 principal stages: semiconductor wafer production, IC manufacturing, and IC packaging. Packaging is thus the last stage in the manufacturing of the IC product. The purpose of packaging is to protect the chip and to connect electrically the chip to a printed circuit board or other adaptable carrier elements. The chip then can be connected to an external device through the carrier element.

Issues related to the conventional packaging structures are now described with the help of FIG. 1, FIG. 2 and FIG. 3.

FIG. 1 schematically shows a cross-sectional view of a conventional stacked-chip packaging structure. Generally, Ball Grid Array structure is employed in combination with a chip stacking structure, like the stacking of memory chips, to increase the capacity of the packaged product. As shown in FIG. 1, a first semiconductor chip 106 is mounted on a substrate 102, a second semiconductor chip 108 is mounted on the first semiconductor chip 106. The substrate 102, the first semiconductor chip 106 and the second semiconductor chip 108 are respectively fixed to one another with an adhesive layer 104. In the following wire bonding process, the first semiconductor chip 106 and the second semiconductor chip 108 are electrically connected to the substrate 102 respectively through wires 110a and 110b. The substrate 102, the first semiconductor chip 106, the second semiconductor chip 108, and the wires 110a and 110b, are encapsulated by a molding compound 114. Finally, solder balls 112 are attached to the substrate 102 to complete the BGA structure. In the foregoing conventional packaging structure, a necessary condition is that the dimensions of the first semiconductor chip 106 have to be greater than the dimensions of the second semiconductor chip 108. For example, the difference between the length of the first semiconductor chip 106 and the length of the second semiconductor chip 108 must be at least 0.3 mm. Otherwise the wire bonding would be difficult to achieve, and the second semiconductor chip 108 may be short-circuited by touching the wire 110a.

FIG. 2A and FIG. 2B are respectively top and cross-sectional views of another conventional packaging structure wherein various semiconductor chips are side-by-side arranged. FIG. 2B is the cross-sectional view of the structure taken along line 2B—2B of FIG. 2A.

As shown in FIG. 2A and FIG. 2B, a principal semiconductor chip 205 and other secondary semiconductor chips 206, 208, 209 and 211 are arranged side-by-side on a substrate 202. The principal semiconductor chip 205, and the secondary semiconductor chips 206, 208, 209 and 211 are bonded to the substrate 202 via a plurality of adhesive layers 204. All the semiconductor chips are electrically connected to the substrate 202 through wires 210. A molding compound 214 encapsulates the substrate 202, the semiconductor chips 205, 206, 208, 209, 211, and the wires 210. Solder balls 212 are attached to the substrate 202 to complete the conventional packaging structure. In such a conventional packaging structure, an advantage is that various semiconductor chips with different functionality can be integrated within a single packaging structure. However, a substantial drawback is that the semiconductor chips occupy a large surface of the substrate 202. As a result, the routability of the substrate 202 becomes more complex, and necessitates the use of a high-density trace substrate. Moreover, the side-by-side arrangement of the semiconductor chips can also limit the number of semiconductor chips that may be arranged on the substrate, which consequently limits also the functions that may be integrated in a single package. The resulting functional enhancement can be thus substantially limited.

FIG. 3 is a cross-sectional view of another conventional stacking structure of a lead frame carrier disclosed in the U.S. Pat. No. 5,291,061 issued to Ball. In this conventional package, two semiconductor chips 306 and 308 have approximately the same size. The first semiconductor chip 306 is placed on the lead frame 302 and, through the wires 310a, is connected to the lead frame 302. Via a polyimide tape 330 placed on the semiconductor chip 306, the second semiconductor chip 308 is stacked on the first semiconductor chip 306. Wires 310b connect the semiconductor chip 308 to the lead frame 302. A molding compound 314 encapsulates the lead frame 302, the semiconductor chips 306 and 308, and the wires 310a and 310b, leaving the outer portion of the leads 332 of the lead frame carrier 302 externally exposed.

Various disadvantages are related to the packaging structure shown in FIG. 3, as discussed hereafter. The cost of the polyimide tape is high, and specific equipment is required to attach the semiconductor chips to the polyimide tape through a high temperature process above 400° C., which causes a high manufacturing cost. Moreover, vis-à-vis the top semiconductor chip, the polyimide tape may generate a "cushion effect" and affect the reliability of the wire bonding. The cushion effect is due to the insufficient rigidity of the semiconductor chips.

SUMMARY OF THE INVENTION

An aspect of the invention is to provide a multiple stacked-chip packaging structure, wherein a plurality of semiconductor chips are contiguously arranged into a plurality of stacked semiconductor chip levels. The multiple stacked-chip packaging structure of the invention prevents a cushion effect and maintains the dimensions of the packaging structure. Without necessitating any specific equipment, the manufacturing cost of the packaging structure of the invention is reduced.

To achieve at least the foregoing aspects of the invention, the multiple stacked-chips packaging structure of the invention comprises: a substrate, a plurality of semiconductor chips having respectively a plurality of bonding pads, a plurality of supporting members, a plurality of adhesive layers, a plurality of bonding wires and a molding compound. The substrate has a front surface and a back surface opposite to the front surface. The semiconductor chips are contiguously mounted into a plurality of semiconductor chip sets that are stacked upon the front surface of the substrate, wherein the size of two consecutive semiconductor chip sets at two adjacent levels of the stack is approximately equal to each other, or their difference does not exceed 0.3 mm. The supporting members are respectively mounted between two consecutive chip sets, while the adhesive layers bond the supporting members, the semiconductor chips, and the substrate to one another. In each semiconductor chip set of the stack structure, the semiconductor chips can be connected to one another or to the substrate. The molding compound encapsulates the front surface of the substrate, the supporting members, the semiconductor chip sets and the adhesive layers.

According to a preferred embodiment of the invention, the adhesive layers are made of silver paste or non-conductive paste such that the process does not require a high temperature, which simplifies the fabrication process and prevents chip cracks from occurring. Besides, the use of thermosonic to perform the wire bonding can prevent the cushion effect from occurring due to an insufficient rigidity of the semiconductor chips. As a result, the reliability of the package can be improved. Moreover, since the semiconductor chip sets are stacked and side-by-side arranged, wherein the size difference between two consecutive semiconductor chip sets is approximately zero or within a tolerance of 0.3 mm, the packaging structure thus obtained has a high density.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification.

The drawings illustrate embodiments of the invention and, together with the description, explain the principles of the invention. In the drawings.

DESCRIPTION OF THE PREFERRED EMBODIMENTS

Figure 1:
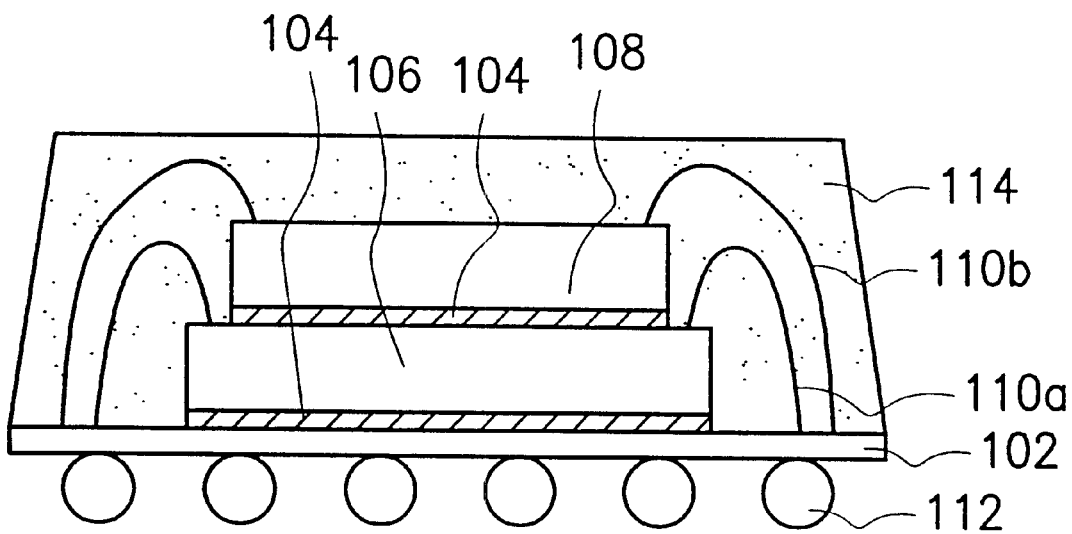
FIG. 1, FIG. 2A, FIG. 2B and FIG. 3 are various views of different conventional packages.
Figure 2A:
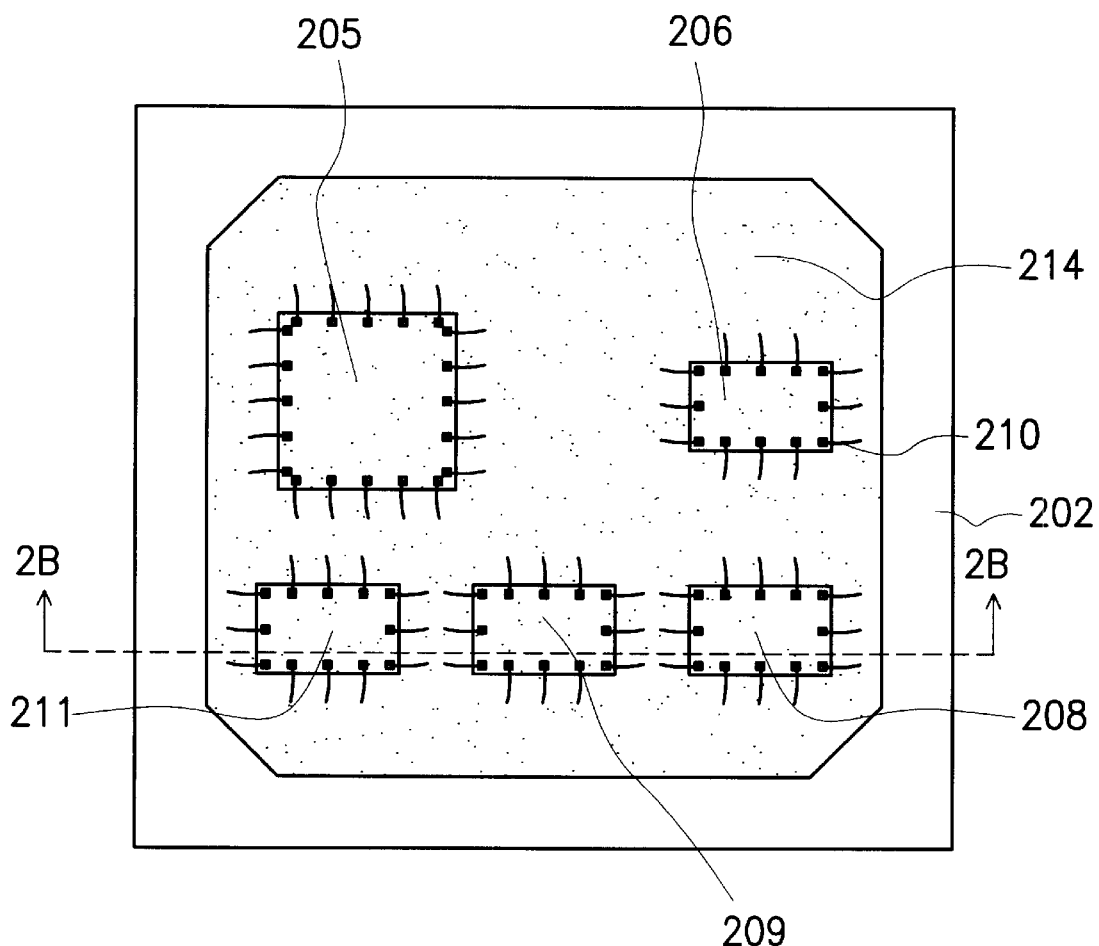
Figure 2B:
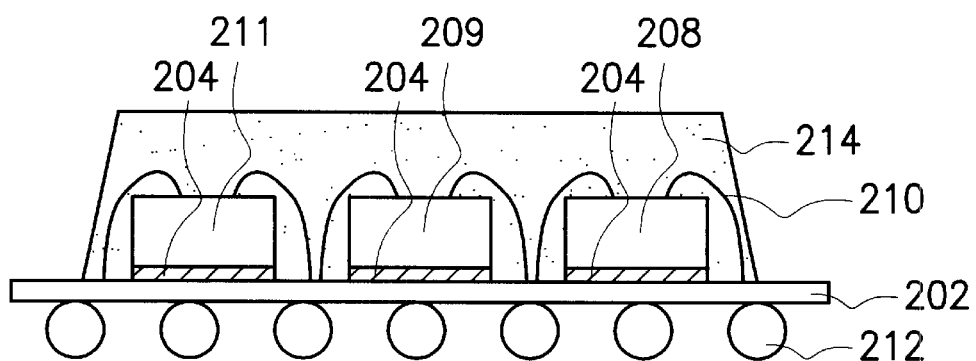
Figure 3:
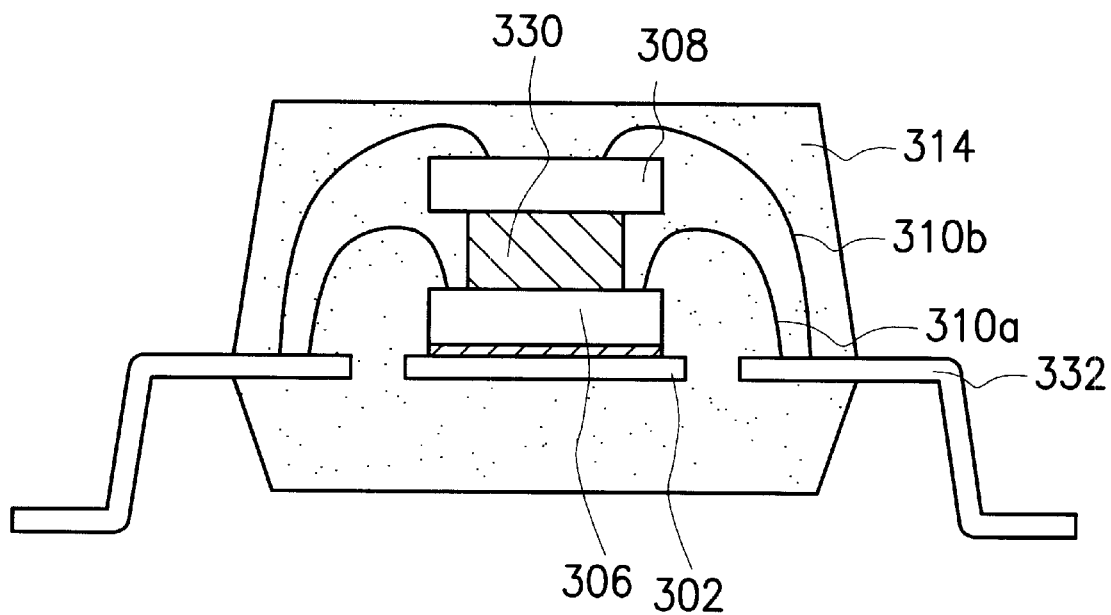
Figure 4A:
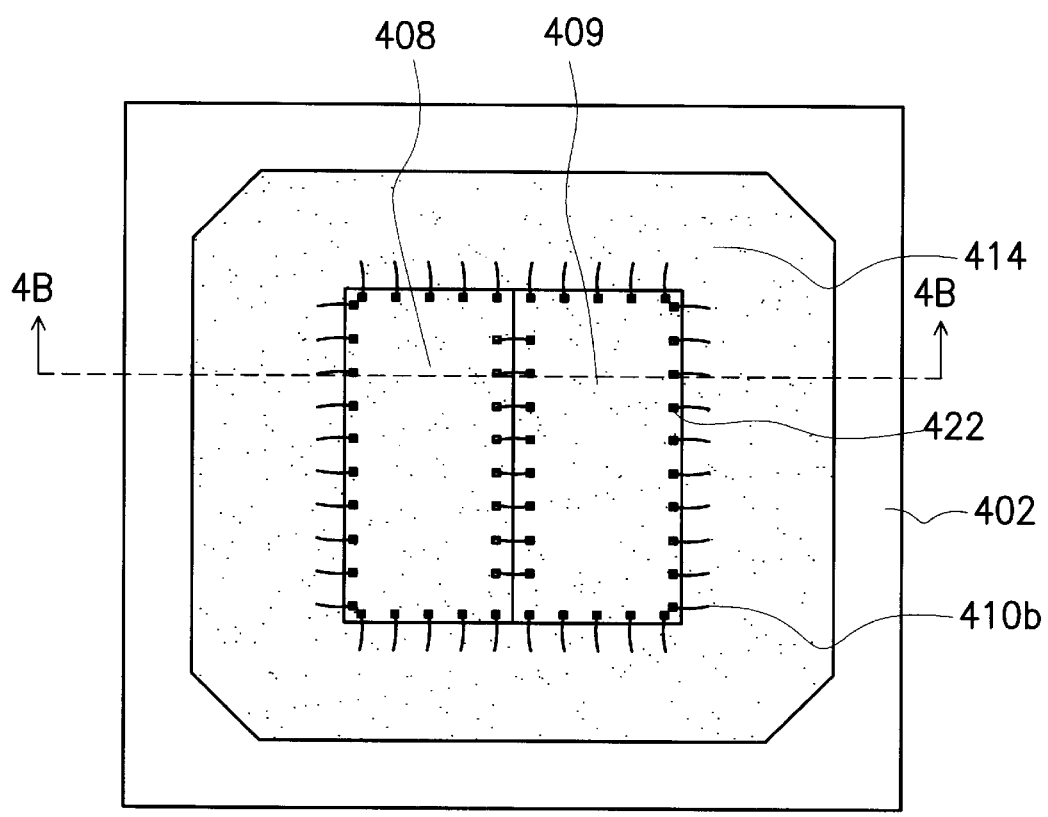
FIG. 4A and FIG. 4B are respectively top and cross-sectional views of a multiple stacked-chip packaging structure according to a first embodiment of the present invention.
Figure 4B:
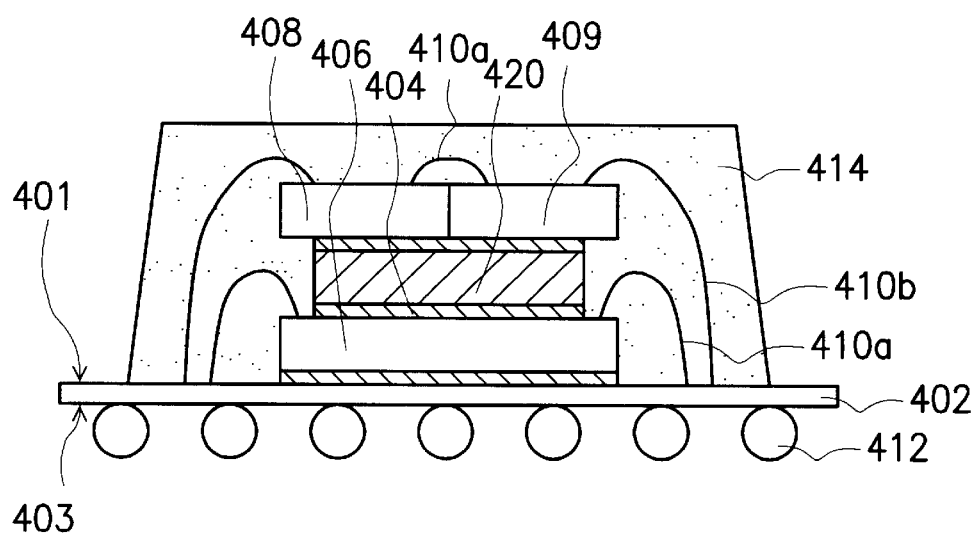

Hereinafter embodiments of the present invention will be explained concretely with the reference to the accompanied drawings. FIG. 4A and FIG. 4B are respectively top and cross-sectional views of a multiple stacked-chips packaging structure according to a first embodiment of the present invention.

Referring to FIGS. 4A and 4B, a substrate 402 has a front surface 401 and an opposite back surface 403. A first semiconductor chip 406, a second semiconductor chip 408, and a third semiconductor 409 have respectively a plurality of bonding pads 422 on the peripheral portions thereof The size of both contiguously-disposedsemiconductor chips 408 and 409 and the size of the first semiconductor chip 406 are approximately equal (or difference less than 0.3 mm). The first semiconductor chip 406 is mounted on the front surface 401 of the substrate 402. Wires 410a connect the bonding pads 422 of the first semiconductor chip 406 to the substrate 402. A supporting member 420 is mounted upon the first semiconductor chip 406. Both contiguously-mounted semiconductor chips 408 and 409 are stacked upon the supporting member 420. The bonding pads 422 of the semiconductor chips 408 and 409 are connected both to each other and to the substrate 402 with wires 410b. The substrate 402, the first semiconductor chip 406, the supporting member 420, the second semiconductor chip 408 and the third semiconductor chip 409 are bonded to one another in the stacked structure by a plurality of adhesive layers 404. The adhesive layer 404 can be made of, for example, silver paste, or any other pastes that are heat conductors and electrical insulators. The use of silver paste does not necessitate a high temperature process and thus simplifies the manufacturing process, and damages to the surface of the semiconductor chips 406, 408, and 409 can be prevented. Besides, the use of thermosonic to perform the wire bonding can prevent the occurrence of cushion effect and improves the reliability of the package. A molding compound 414 encapsulates the front surface 401 of the substrate 402, the supporting member 420, the semiconductor chips 406, 408, and 409, and the adhesive layers 404. The molding compound 414 can be made of Epoxy or other insulating material. Solder balls 412 are attached to the back surface 403 of the substrate 402 to allow input/output functions of the structure. The supporting member 420 can be made of silicon, dummy chip, or another metallic material. The characteristics of the supporting member must be good heat conductivity and a coefficient of expansion close to that of the stacked semiconductor chips, in order not to generate mechanical stress in the semiconductor chips when heated.

Figure 5A:
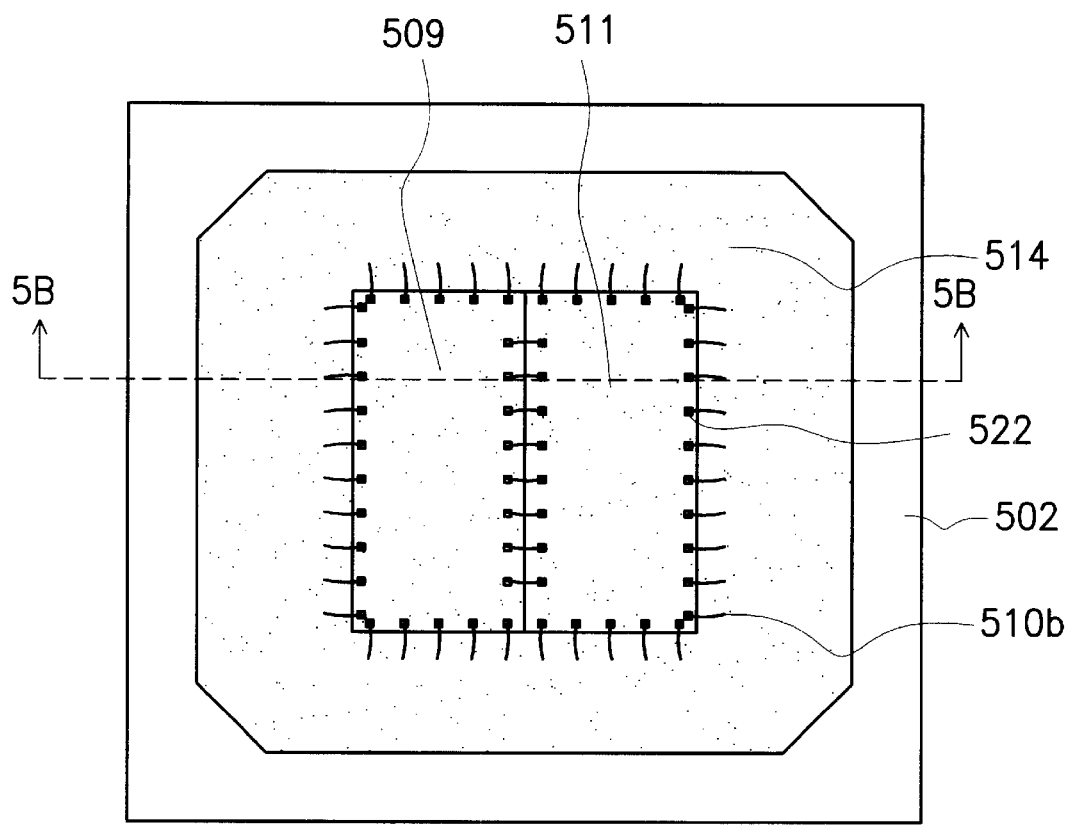
FIG. 5A through FIG. 5F are various top and cross-sectional views of a multiple stacked-chips packaging structure according to a second embodiment of the present invention.
Figure 5B:
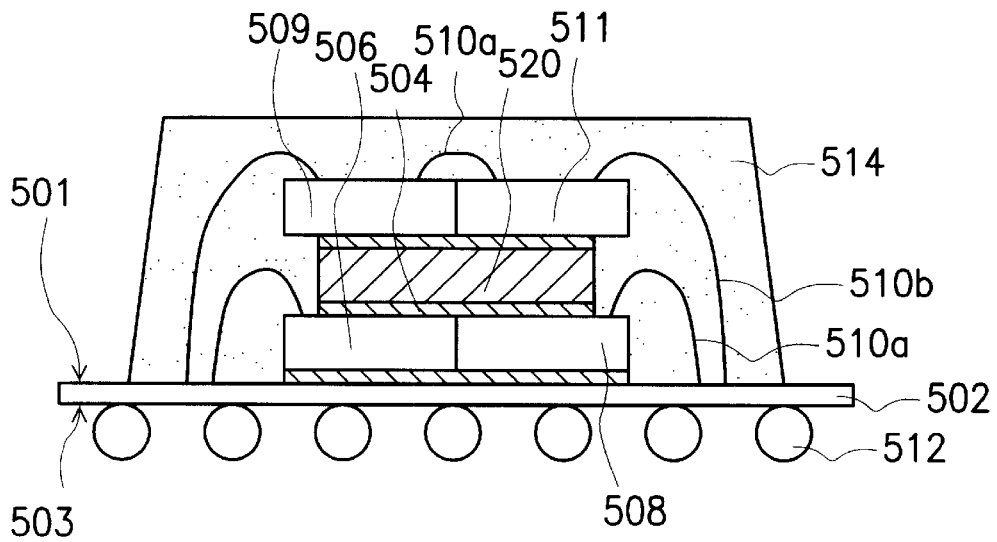

FIG. 5A and FIG. 5B show a multiple stacked-chip packaging structure according to a second embodiment of the invention. FIG. 5A is a top view of the packaging structure and FIG. 5B is cross-sectional view of the packaging structure. Referring to FIG. 5A and FIG. 5B, a substrate 502 has a front surface 501 and an opposite back surface 503. A first semiconductor chip 506, a second semiconductor chip 508, a third semiconductor chip 509, and a fourth semiconductor chip 511 have respectively a plurality of bonding pads 522. The size of both contiguously mounted semiconductor chips 506 and 508 and the size of both contiguously mounted semiconductor chips 509 and 511 are approximately equal. First, the semiconductor chips 506 and 508 are contiguously mounted on the front side 501 of the substrate 502, the bonding pads 522 of each of the semiconductor chips being respectively connected to the substrate 502 through a plurality of wires 510a. A supporting member 520, a semiconductor chip 509 and a semiconductor chip 511 are respectively stacked upon the contiguously mounted semiconductor chips 506 and 508, wherein the semiconductor chips 509 and 511 are contiguously mounted upon the supporting member 520. A plurality of wires 510b respectively connect the bonding pads 522 of each of the contiguously-mounted semiconductor chips 509 and 511 both to one another and to the substrate 502. The adhesive layers 504 bond to one another the substrate 502, the supporting member 520, and the semiconductor chips 506, 508, 509, and 511. Subsequently, a molding compound 514 encapsulates the front surface 501, the semiconductor chips 506, 508, 509, 511, the supporting member 520 and the adhesive layers 504. Finally, solder balls 512 are attached to the back surface 503 of the substrate 502.

Figure 5C:
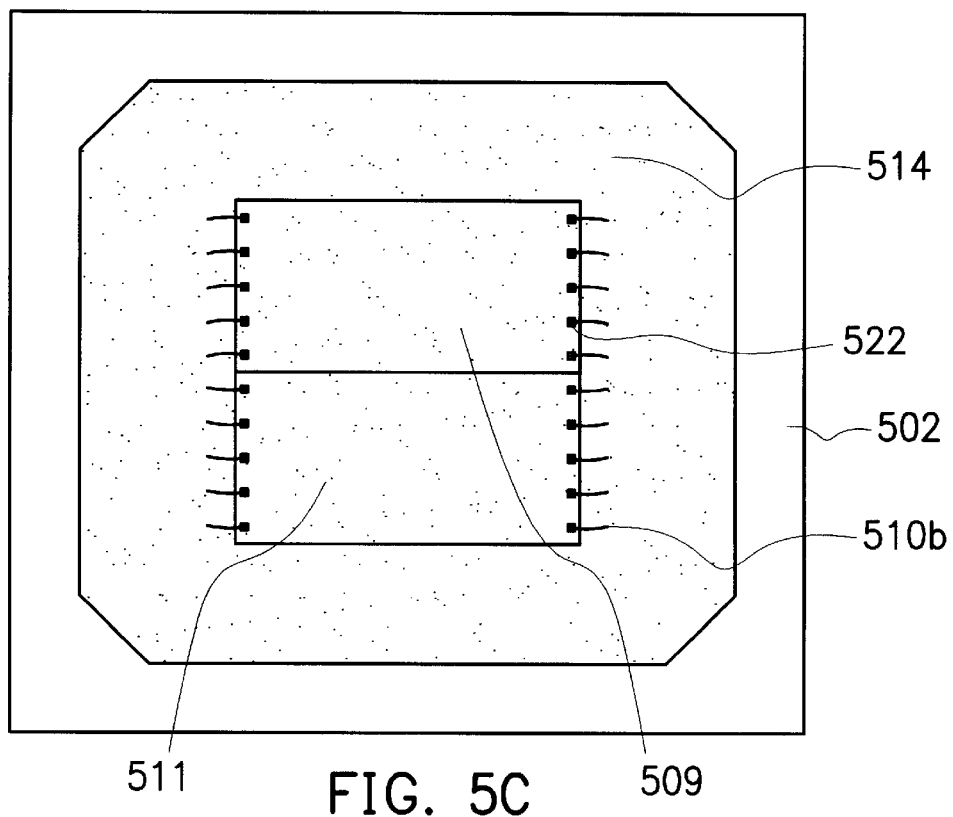
Figure 5D:
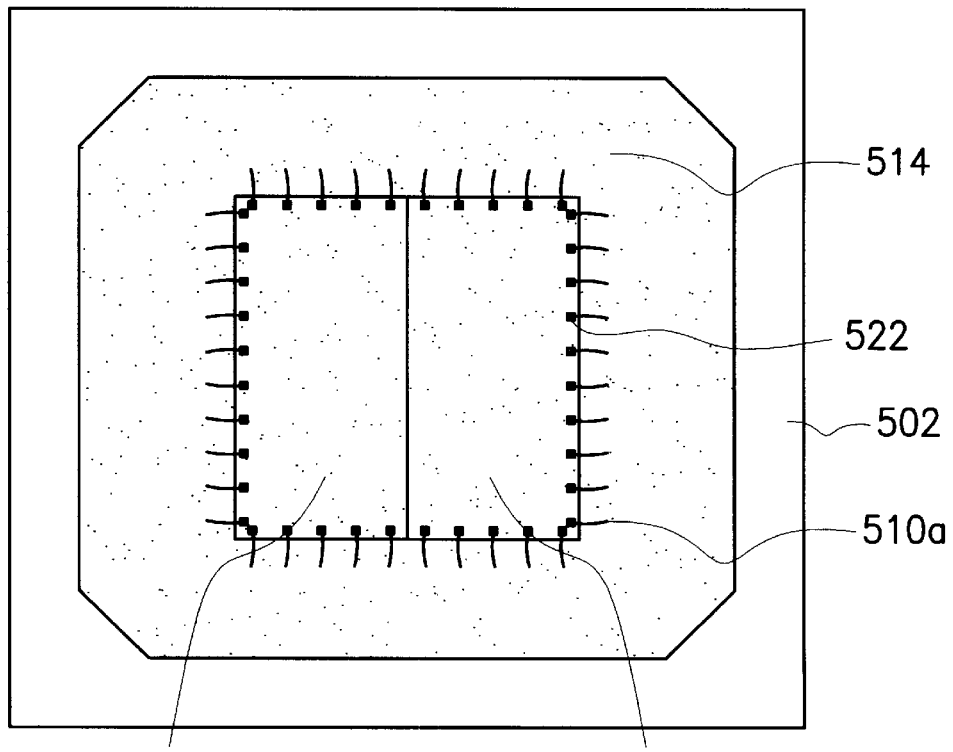
Figure 5E:
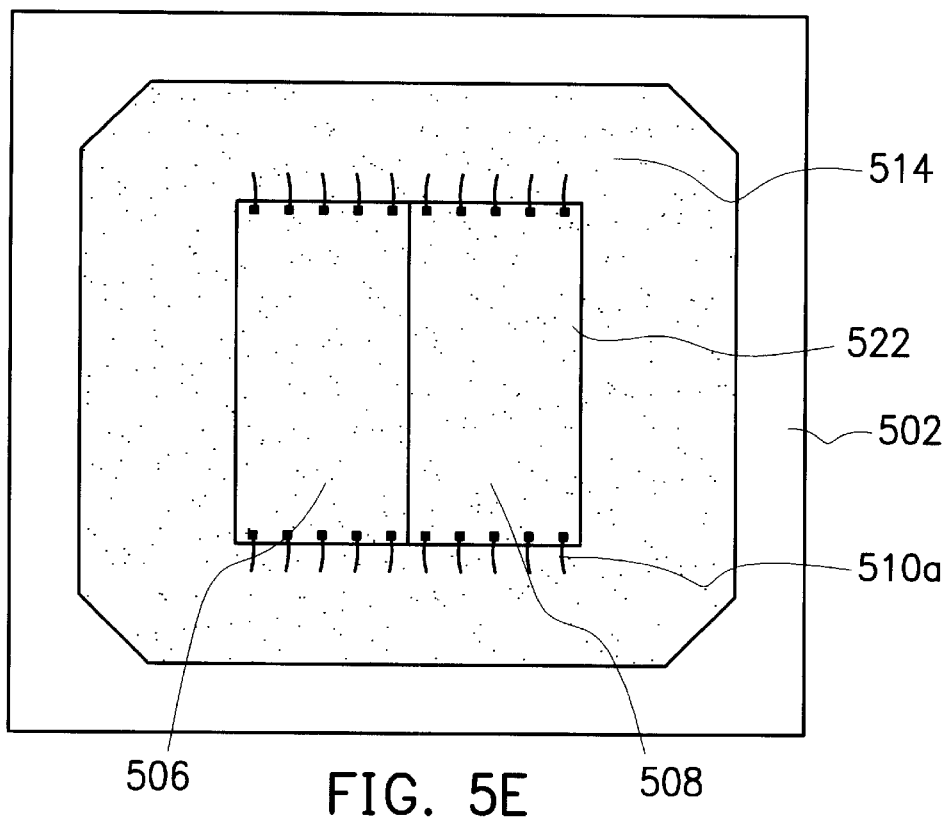
Figure 5F:
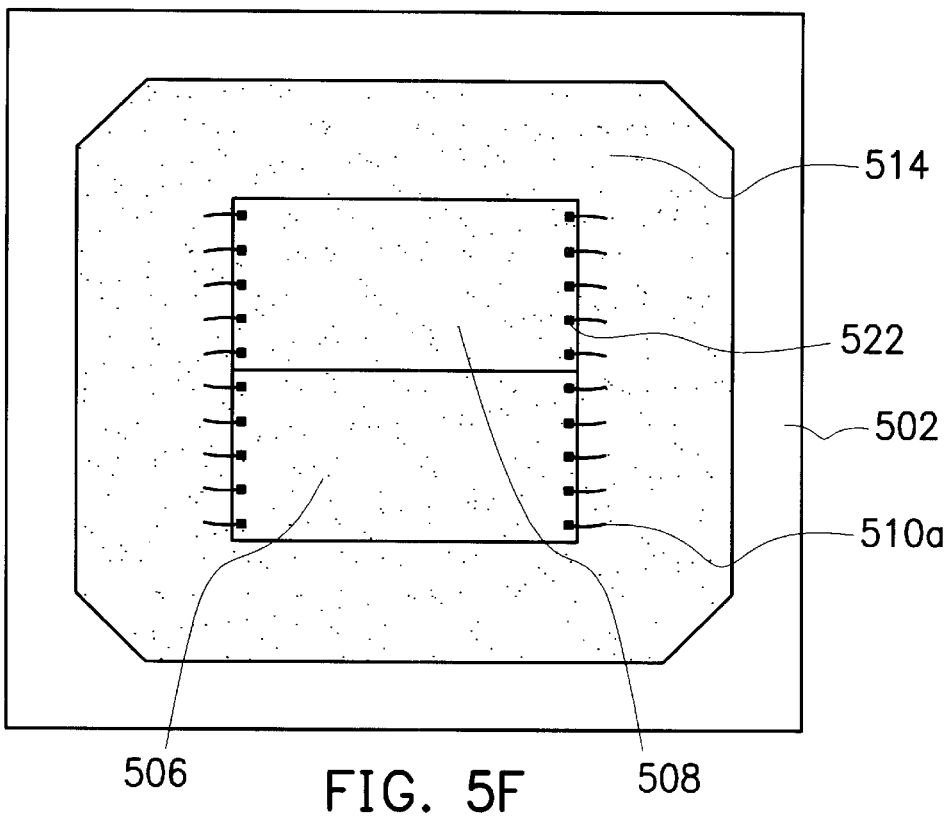

As shown in FIG. 5C, two outer edges of the contiguously-mounted semiconductor chips 509 and 511 of the upper level can be without bonding pads, while the bonding pads 522 at two others outer edges of the semiconductor chips are connected to the substrate 502 through the wires 510b. As shown in FIG. 5D, the first and second semiconductor chips 506 and 508, via bonding pads 522 disposed at the peripheral of the both assembled, can be connected to the substrate 502 through the wires. As shown in FIG. 5E and FIG. 5F, another possibility is that, according to the orientation of the assembly of both semiconductor chips 506 and 508, only two sides of both semiconductor chips 506 and 508 provided with bonding pads 522 are either longitudinally or transversally connected to the substrate 502.

Figure 6A:
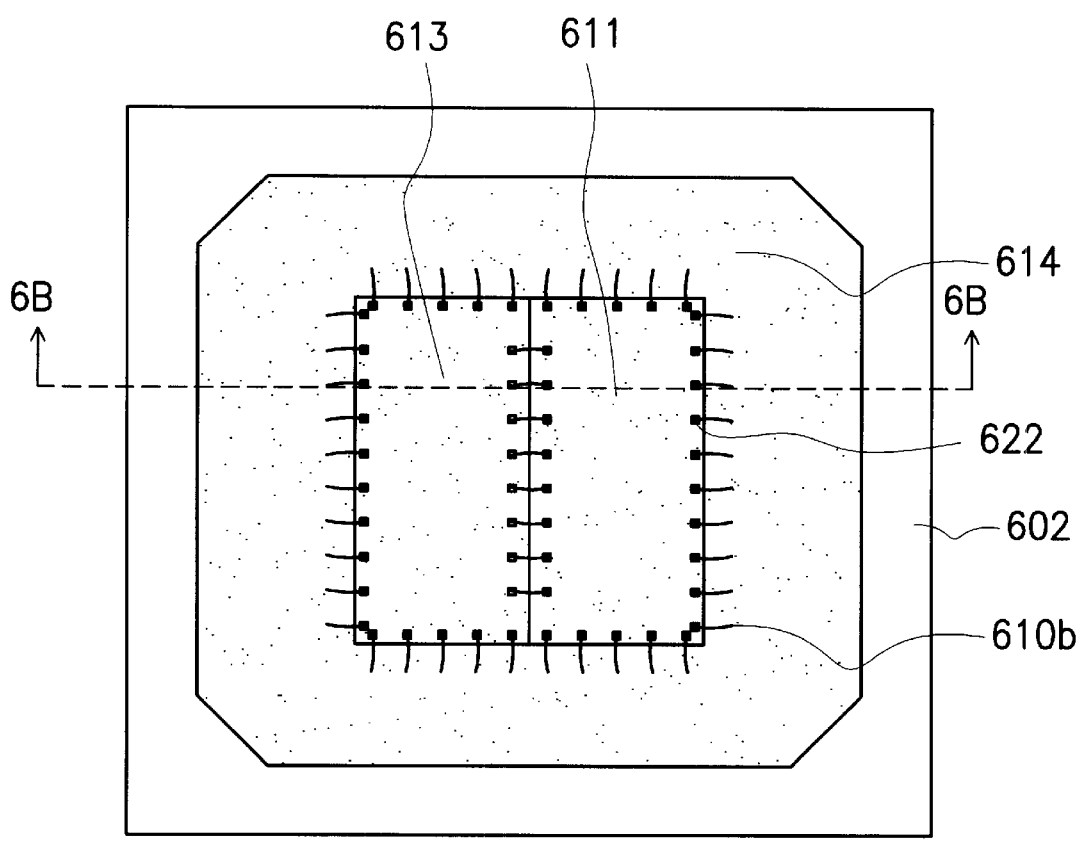
FIG. 6A through FIG. 6C are various top and cross-sectional views of a multiple stacked-chip packaging structure according to a third embodiment of the present invention.
Figure 6B:
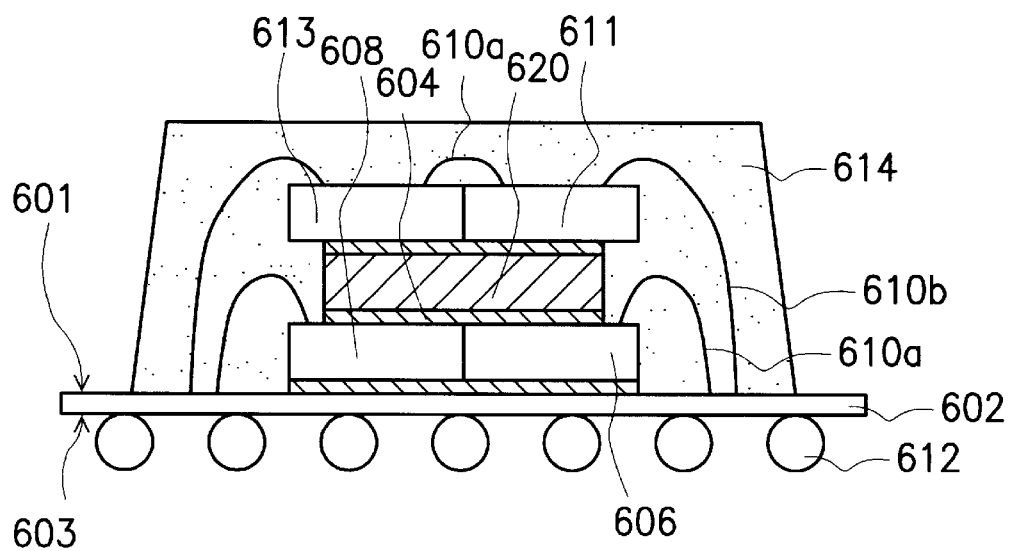
Figure 6C:
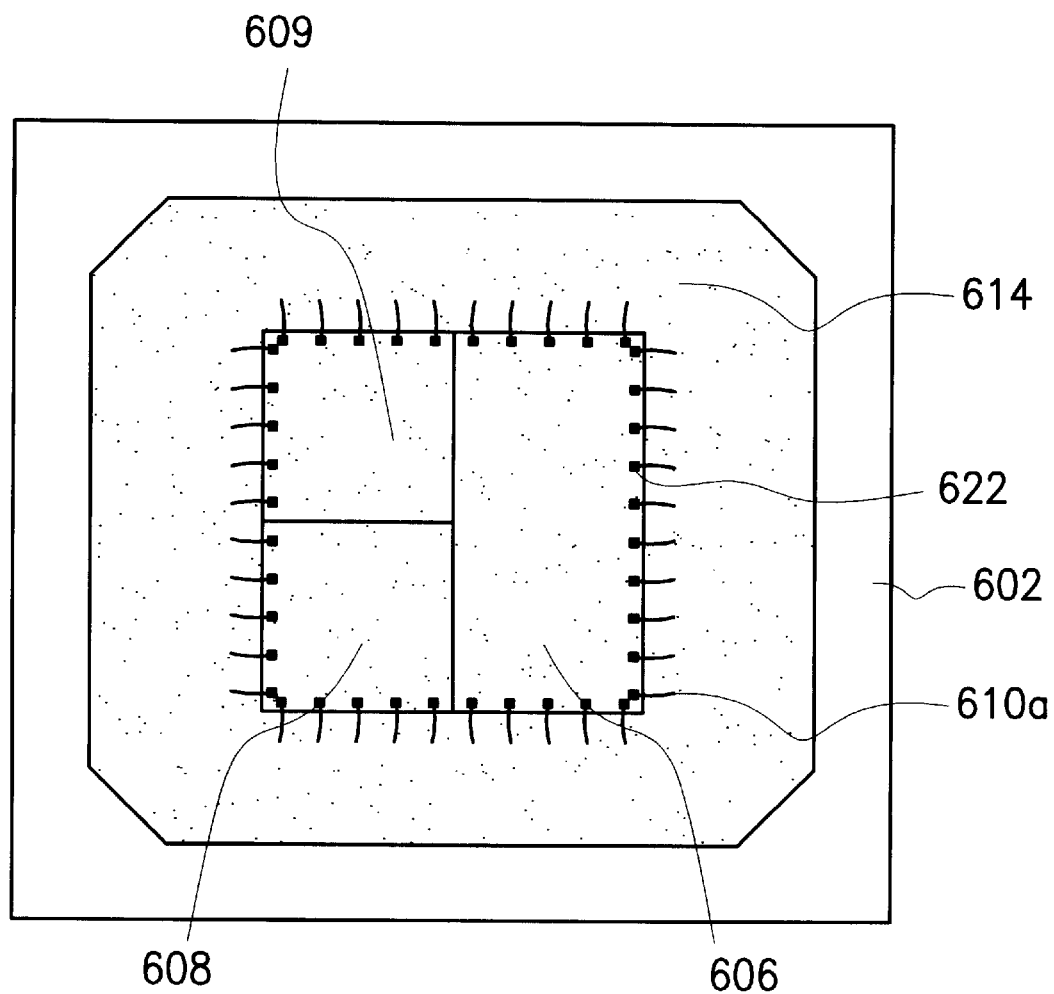

FIG. 6A, FIG. 6B, and FIG. 6C are various views of a multiple stacked-chip packaging structure according to a third embodiment of the present invention. FIG. 6A is a top view of the packaging structure, FIG. 6B is a cross-sectional view along the section 6B—6B of FIG. 6A, and FIG. 6C is a top view of the first level of the stack of the multiple stacked-chips package structure.

Referring to FIGS. 6A, 6B and 6C, a substrate 602 has a front surface 601 and an opposite back surface 603. Semiconductor chips 606, 608, 609, 611, 613 have respectively a plurality of bonding pads 622. The semiconductor chips 606, 608, and 609 are contiguously mounted into a first semiconductor chip set and the semiconductor chips 611 and 613 are contiguously mounted into a second semiconductor chip set. The size deviation between the first and second semiconductor chip sets is less than 0.3 mm. The semiconductor chips 606, 608, 609 are contiguously mounted into a first semiconductor chip set on the front surface 601 of the substrate 602. A plurality of wires 610a connect the bonding pads 622 of each of the semiconductor chips 606, 608, 609 to the substrate 602. A supporting member 620 and the semiconductor 611 and 613 contiguously mounted within the second semiconductor chip set are stacked upon the first semiconductor chip set of contiguously mounted semiconductor chips 606, 608, 609.

As shown in FIG. 6A, the wires 610b connect the semiconductor chips 611 and 613 both to the substrate 602 and possibly to each other. A plurality of adhesive layers bond the substrate, the semiconductor chips 606, 608, 609, 611, 613 and the supporting member 620 to one another. A molding compound 614 encapsulates the front surface 601 of the substrate 602, the supporting member 620, and the semiconductor chips 606, 608, 609, 611, 613. Solder balls 603 are mounted to the back surface 603 of the substrate 602.

As described above in the third embodiment of the present invention, five semiconductor chips 606, 608, 609 611, 613 can be integrated on a single substrate in a stacked structure. The present invention thus allows the assembly of at least two semiconductor chips according to a stacking structure into a same package, wherein each level of the stack contains one or a plurality of contiguously-mounted semiconductor chips and is separated to each other by a supporting member. Furthermore, the stacked-chips structure thus obtained is dimensionally stable.

In conclusion, the invention provides the following improvements.

1. the use of silver paste or other insulator paste as adhesive layer does not necessitate a high temperature process, which simplifies the manufacturing process and prevents the damage of the semiconductor chips;
2. the use of silver paste or other heat conductor and electrical insulator paste as adhesive layer, as well as the use of thermosonic for wires bonding can prevent the cushion effect that would otherwise occur due to the insufficient rigidity of semiconductor chips;
3. a plurality of semiconductor chips can be integrated in a single package and the dimensional stability of the stacked-chips structure can be maintained;
4. a dimensional difference between the size of the semiconductor chip sets can be less than 0.3 mm, which improves the density of the semiconductor chips integrated and pushes back the current limit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multiple stacked-chip package comprising:
   at least a first semiconductor chip set comprising at least two semiconductor chips over a substrate, each having a plurality of bonding pads, positioned adjacent to each other along a same plane;
   at least a second semiconductor chip set disposed over the first semiconductor chip set;
   at least a supporting member separating the second semiconductor chip set from the first semiconductor chip set;
   a plurality of heat conductive adhesive layers bonding the supporting members, the semiconductor chips and the substrate to one another, wherein said semiconductor chips of said first semiconductor chip set are bonded together through said heat conductive adhesive layers; and
   a plurality of wires connecting the first and second semiconductor chips sets to a substrate through the bonding pads, wherein a wiring bonding for wire connection is accomplished by a thermosonic method.

2. A multiple stacked-chip package comprising:
   at least a first semiconductor chip set comprising at least two semiconductor chips over a substrate, each having a plurality of bonding pads, positioned adjacent to each other along a same plane;
   at least a second semiconductor chip set comprising at least two semiconductor chips, each having a plurality of bonding pads, positioned adjacent to each other along a same plane and connected together using a plurality of wires through the bonding pads, disposed over the first semiconductor chip set;
   at least a supporting member separating the second semiconductor chip set from the first semiconductor chip set; and
   a plurality of heat conductive adhesive layers bonding the supporting members, the semiconductor chips and the substrate to one another, wherein said semiconductor chips of said second semiconductor chip set are bonded together through said heat conductive adhesive layers; and a plurality of wires connecting the first and second semiconductor chips sets to a substrate through the bonding pads, wherein a wiring bonding for wire connection is accomplished by a thermosonic method.

3. The multiple stacked-chip package of claim 1, wherein the substrate comprises a plurality of solder balls at a back surface.

4. The multiple stacked-chip package of in claim 1, wherein the supporting member is made of silicon.

5. The multiple stacked-chip package of claim 1, wherein the supporting member is a dummy chip.

6. The multiple stacked-chip package of claim 1, wherein the supporting member is made of a metallic material having a coefficient of expansion close to that of the semiconductor chips.

7. The multiple stacked-chip package of claim 1, wherein the heat conductive adhesive layers are made of silver paste.

8. The multiple stacked-chip package of claim 1, wherein an epoxy mold encapsulate a front surface of the substrate, the semiconductor chips, the supporting member and the adhesive layers.

9. The multiple stacked-chip package of claim 2, wherein the size deviation between each of the semiconductor chip sets is less than 0.3 mm.

10. The multiple stacked-chip package of claim 2, wherein the substrate comprises a plurality of solder balls at a back surface.

11. The multiple stacked chip package of in claim 2, wherein the supporting member is made of silicon.

12. The multiple stacked-chip package of claim 2, wherein the supporting member is a dummy chip.

13. The multiple stacked-chip package of claim 2, wherein the supporting member is made of a metallic material having a coefficient of expansion close to that of the semiconductor chips.

14. The multiple stacked-chip package of claim 2, wherein the adhesive layers are made of silver paste.

15. The multiple stacked-chip package of claim 2, wherein an epoxy mold encapsulate a front surface of the substrate, the semiconductor chips, the supporting member and the adhesive layers.

* * * * *